(12) United States Patent
Yu et al.

(10) Patent No.: US 12,111,339 B2
(45) Date of Patent: Oct. 8, 2024

(54) STATE DETECTION CIRCUIT FOR DETECTING TRI-STATE AND STATE DETECTION METHOD THEREOF

(71) Applicant: Richtek Technology Corporation, Zhubei (TW)

(72) Inventors: Chun-Jen Yu, Taoyuan (TW); Hsuan-Kai Wang, Taoyuan (TW); Chi-Jen Yang, Hsinchu (TW); Hsien-Chih She, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 159 days.

(21) Appl. No.: 18/050,928

(22) Filed: Oct. 28, 2022

(65) Prior Publication Data

US 2023/0160935 A1    May 25, 2023

Related U.S. Application Data

(60) Provisional application No. 63/281,516, filed on Nov. 19, 2021.

(30) Foreign Application Priority Data

Jun. 10, 2022   (TW) .................................. 111121627

(51) Int. Cl.
  *G01R 19/165* (2006.01)
  *G01R 31/317* (2006.01)
(52) U.S. Cl.
  CPC ....... *G01R 19/1659* (2013.01); *G01R 31/317* (2013.01)

(58) Field of Classification Search
  CPC .............. G01R 19/1659; G01R 31/317; G01R 31/31701; G01R 31/31924; G01R 31/52; G01R 31/36; G01N 35/1065
  See application file for complete search history.

(56) References Cited

U.S. PATENT DOCUMENTS 5,198,707 A * 3/1993 Nicolai ............ G01R 31/31701
                                                326/103
5,469,086 A * 11/1995 Bahng ............... G01R 31/31701
                                                327/182
5,561,391 A * 10/1996 Wellnitz ............. H03K 17/0822
                                                327/309

(Continued)

FOREIGN PATENT DOCUMENTS

CN         209472611 U    10/2019

*Primary Examiner* — Vinh P Nguyen
(74) *Attorney, Agent, or Firm* — Tung & Associates

(57) ABSTRACT

A state detection circuit for detecting whether a state of an input node is floating, grounded, or electrically connected to an external voltage includes: a unidirectional device circuit and a determination circuit. The unidirectional device circuit electrically conducts a test node to a detection node unidirectionally. The detection node is coupled to the input node. The test node, the unidirectional device circuit, the detection node and the input node form a current path. The determination circuit determines a state of the input node according to a voltage level of the detection node. Within a detection stage, the state detection circuit provides a test voltage at the test node. A voltage of the detection node is determined by the input node, the test voltage, and a characteristic of the unidirectional device circuit.

19 Claims, 15 Drawing Sheets

(56) References Cited

U.S. PATENT DOCUMENTS

| | | | |
|---|---|---|---|
| 6,788,095 B1 * | 9/2004 | Mark | G01R 31/3008 |
| | | | 324/762.03 |
| 6,864,719 B2 * | 3/2005 | Iwase | G01R 31/2884 |
| | | | 326/83 |
| 10,826,311 B2 * | 11/2020 | Ohtake | H02M 7/06 |

* cited by examiner

STATE DETECTION CIRCUIT FOR DETECTING TRI-STATE AND STATE DETECTION METHOD THEREOF

CROSS REFERENCE

The present invention claims priority to U.S. Ser. No. 63/281,516 filed on Nov. 19, 2021 and claims priority to TW 111121627 filed on Jun. 10, 2022.

BACKGROUND OF THE INVENTION

Field of Invention

The present invention relates to a state detection circuit, in particular to a state detection circuit with a tri-state detection function. The present invention also relates to a control method for controlling the state detection circuit.

Description of Related Art

Referring to FIG. 1, a state detection circuit is disclosed in U.S. Pat. No. 5,469,086. As shown in FIG. 1, the state detection circuit 1000 includes a pulse generator 101, a counter 201, and a floating state determiner 301. During test, the pulse generator 101 generates pulses according to the state of the input node Nin1, and the counter 201 counts the number of pulses generated by the pulse generator 101. The floating state determiner 301 determines the state of the input node Nin1 according to the number of pulses counted by the counter 201. When the number of pulses counted by the counter 201 exceeds a certain number, the floating state determiner 301 determines that the input node Nin1 is floating; otherwise, it determines that the input node Nin1 is in a non-floating state. The conventional circuit shown in FIG. 1 is complicated and has limitations that it can only be used for low-voltage detection, and can only determine whether the input node Nin1 is in a floating state, but cannot determine other states of the input node Nin1 (for example, cannot determine whether the input node Nin1 is electrically connected to an external voltage or ground potential).

FIG. 2 shows another state detection circuit of the conventional art. In the state detection circuit 2000, the state determiner 402 determines the state of the input node Nin2 according to the voltage level of the detection node Vdet', and then generates the signal SFG. When the voltage level of the detection node Vdet' is less than the voltage threshold Vth, the signal SFG indicates that the state of the input node Nin2 is electrically connected to the ground potential; when the voltage level of the detection node Vdet' is greater than the voltage threshold Vth, the signal SFG indicates that the state of the input node Nin2 is floating. The conventional art of FIG. 2 can only determine two states of the input node Nin2, i.e., grounded or floating, and has disadvantages such as high quiescent current and large area size.

Compared with the aforementioned conventional arts, the state detection circuit of the present invention can be used to detect tri-state, that is, to detect whether an external pin is in the state of floating, electrically connected to ground potential, or electrically connected to an external voltage. In addition, the state detection circuit of the present invention is simple in structure and does not occupy a large area, and can be applied to high and low voltage applications without being limited to low voltage detection.

SUMMARY OF THE INVENTION

From one perspective, the present invention provides a state detection circuit configured to detect whether a state of an input node is floating, electrically connected to a ground potential, or electrically connected to an external voltage, wherein the state detection circuit comprises:

a unidirectional device circuit, configured to unidirectionally conduct a test node to a detection node, the detection node being coupled to the input node, wherein a current path is formed by the test node, the unidirectional device circuit, the detection node, and the input node; and a determination circuit, configured to determine the state of the input node according to a voltage level of the detection node; wherein in a detection stage, the state detection circuit provides a test voltage at the test node, wherein the voltage level of the detection node is determined according to the state of the input node, the test voltage, and a characteristic of the unidirectional device circuit.

In one embodiment, in the detection stage, the determination circuit determines the state of the input node according to at least one of the following conditions: when the voltage level of the detection node is less than a first threshold and greater than a second threshold, the determination circuit determines that the state of the input node is floating; when the voltage level of the detection node is less than the second threshold, the determination circuit determines that the state of the input node is electrically connected to the ground potential; and/or when the voltage level of the detection node is greater than the first threshold, the determination circuit determines that the state of the input node is electrically connected to the external voltage; wherein the first threshold is greater than the second threshold.

In one embodiment, the state detection circuit further includes further comprising a discharge circuit coupled to the detection node, wherein in a discharge stage, the state detection circuit provides a ground potential at the test node, the discharge circuit being configured to electrically connect the ground potential of the test node to the detection node and the input node, so as to discharge the voltage levels of the detection node and the input node to the ground potential, wherein the discharge stage is earlier than the detection stage.

In one embodiment, the discharge circuit is coupled in parallel with the unidirectional device circuit.

In one embodiment, the discharge circuit includes a first transistor, which is a switch of a metal-oxide-semiconductor (MOS) transistor, and the unidirectional device circuit comprises a body diode of the MOS transistor.

In one embodiment, the state detection circuit further includes a buffer circuit configured to generate the test voltage or the ground potential at the test node according to a driving signal.

In one embodiment, the state detection circuit further includes a control circuit configured to generate a first control signal and the driving signal, thereby controlling the state detection circuit to operate in the detection stage or the discharge stage, wherein the discharge circuit operates according to the first control signal.

In one embodiment, the state detection circuit further includes a clamping device coupled between the input node and the detection node, so that the voltage level of the detection node is clamped and does not exceed a voltage upper limit, wherein the voltage upper limit is less than the smallest one of the following: an absolute maximum rating of a withstand voltage of the unidirectional device circuit, an absolute maximum rating of a withstand voltage of the discharge circuit, and an absolute maximum rating of a withstand voltage of the determination circuit; wherein the voltage level of the external voltage is greater than the absolute maximum rating of the withstand voltage of the unidirectional device circuit, the absolute maximum rating of the withstand voltage of the discharge circuit, or the absolute maximum rating of the withstand voltage of the determination circuit.

In one embodiment, the clamping device is a metal-oxide-semiconductor transistor having a turn-on threshold voltage, wherein the upper voltage limit is related to the turn-on threshold voltage and an enabling level of the MOS transistor.

In one embodiment, the enabling level of the MOS transistor is a sum of the test voltage and the turn-on threshold voltage, so that the upper voltage limit is equal to the test voltage.

In one embodiment, the first threshold is less than the upper voltage limit.

In one embodiment, the state detection circuit is used in a multi-pin state detection circuit, wherein the multi-pin state detection circuit comprises: a plurality of the state detection circuits, wherein the test nodes of the plurality of state detection circuits are commonly coupled to a common test node, wherein in the detection stage, the multi-pin state detection circuit provides a common test voltage at the common test node, and wherein during the discharge stage, the multi-pin state detection circuit provides the ground potential at the common test node; and a shared buffer circuit, configured to generate the common test voltage or the ground potential at the common test node according to a common driving signal.

In one embodiment, the state detection circuit further includes a resistor, wherein the resistor is coupled between the input node and the detection node for limiting the level of a current flowing through the current path in the detection stage.

In one embodiment, a resistance of the resistor is less than an equivalent resistance of the unidirectional device circuit when it is turned on, so that when the state of the input node is electrically connected to the ground potential, in the detection stage, the voltage level of the detection node is less than the second threshold.

In one embodiment, the unidirectional device circuit comprises a P-N junction diode, a Schottky diode, a Zener diode, or a diode-coupled transistor.

In one embodiment, the unidirectional device circuit comprises a forward conduction voltage, wherein the second threshold is less than a difference between the test voltage and the forward conduction voltage, and the first threshold value is greater than the difference between the test voltage and the forward conduction voltage.

In one embodiment, the external voltage is greater than or equal to the test voltage.

In one embodiment, the clamping device is a depletion-type MOS transistor, or a depletion-type lateral diffused MOS transistor.

From another perspective, the present invention provides a state detection method, configured to detect that a state of an input node is floating, electrically connected to a ground potential, or electrically connected to an external voltage, wherein the state detection method comprises: providing a unidirectional device circuit configured to unidirectionally conduct a test node to a detection node, and electrically conducted the detection node to the input node, so that the test node, the unidirectional device circuit, the detection node, and the input node form a current path; and determining a state of the input node according to a voltage level of the detection node; wherein in a detection stage, a test voltage is provided at the test node, wherein the voltage level of the detection node is determined according to the state of the input node, the test voltage, and a characteristic of the unidirectional device circuit.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
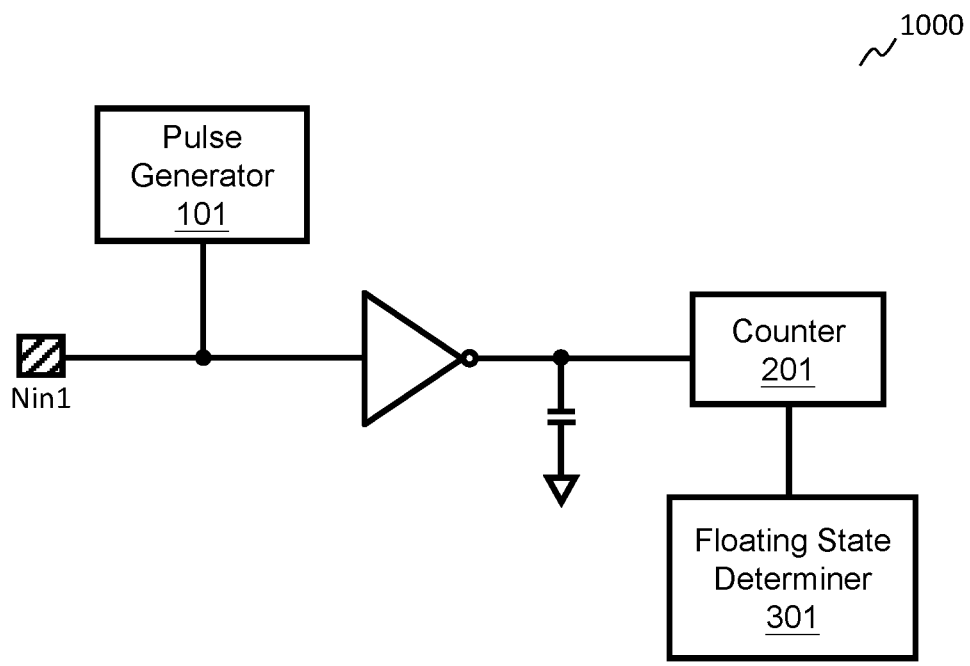
FIG. 1 shows a state detection circuit according to a conventional art.
Figure 2:
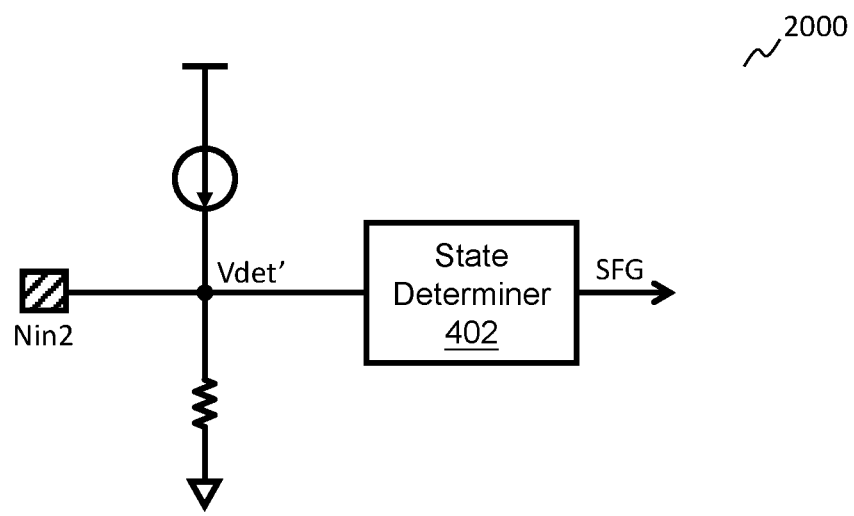
FIG. 2 shows a state detection circuit according to another conventional art.
Figure 3:
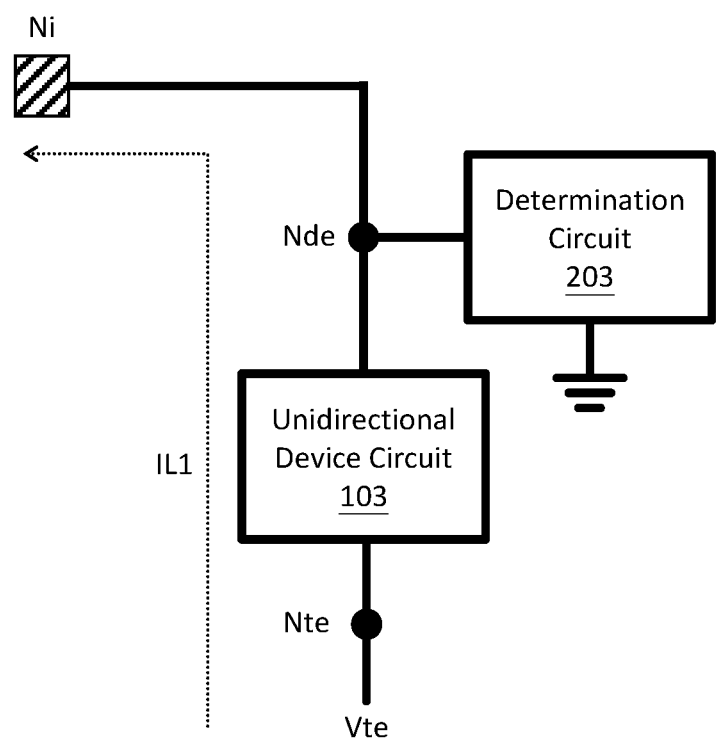
FIG. 3 shows a block diagram of a state detection circuit according to an embodiment of the present invention.

Please refer to FIG. 3. FIG. 3 shows a block diagram of a state detection circuit according to an embodiment of the present invention (state detection circuit 3003). In one embodiment, the state detection circuit 3003 includes a unidirectional device circuit 103, and a determination circuit 203. The state detection circuit 3003 is configured to detect whether the state of the input node Ni is floating, electrically connected to the ground potential, or electrically connected to external voltage. In the present embodiment, the unidirectional device circuit 103 is configured to unidirectionally conduct the test node Nte to the detection node Nde, wherein the detection node Nde is coupled to the input node Ni, and the determination circuit 203 is configured to determine the state of the input node Ni according to the voltage level of the detection node Nde. In one embodiment, a current path IL1 is formed by the test node Nte, the unidirectional device circuit 103, the detection node Nde, and the input node Ni. In one embodiment, when the state detection circuit 3003 operates in the detection stage, the state detection circuit 3003 provides the test voltage Vte at the test node Nte, wherein the voltage level of the detection node Nde is determined according to the characteristics of the state of the input node Ni, the test voltage Vte, the current path IL1, and the unidirectional device circuit 103. It should be noted that the existence of the current path IL1 is related to the test voltage Vte and the electrical state of the input node Ni; when the input node Ni operates in certain states, the current path IL1 may not exist.

Figure 4A:
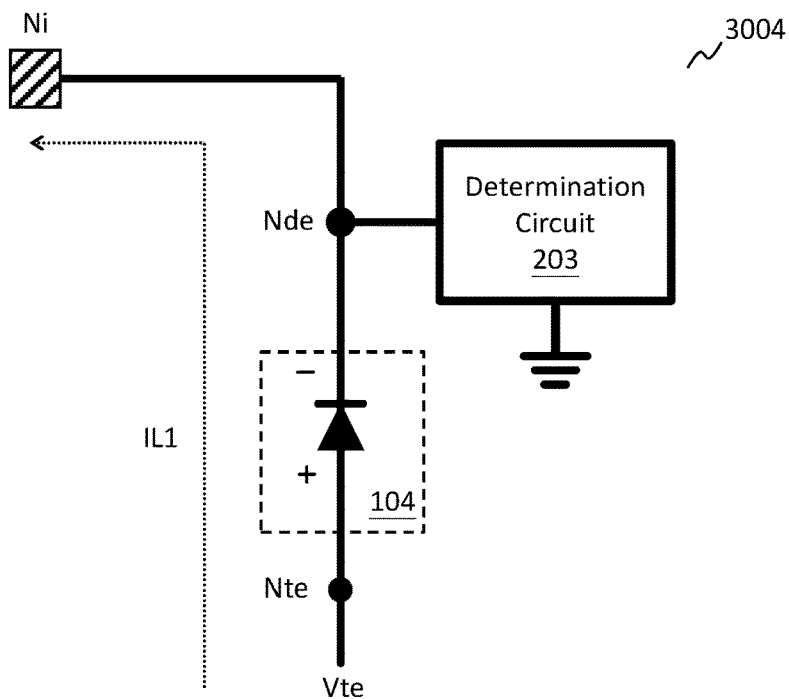
FIG. 4A shows a schematic diagram of a state detection circuit according to an embodiment of the present invention.
Figure 4B:
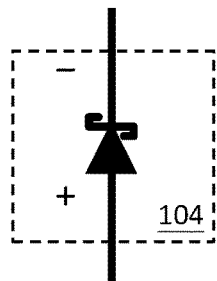
FIG. 4B to FIG. 4E respectively show schematic diagrams of unidirectional device circuits of the state detection circuit according to several embodiments of the present invention.
Figure 4C:
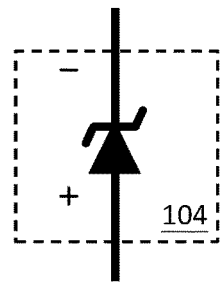
Figure 4D:
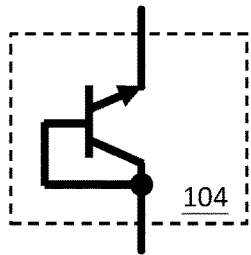
Figure 4E:
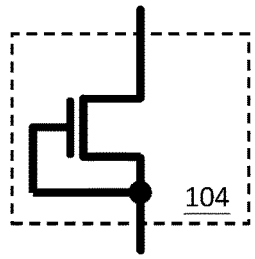

Referring to FIGS. 4A to 4E, FIG. 4A shows a schematic diagram of a state detection circuit of an embodiment of the present invention (state detection circuit 3004), and FIGS. 4B to 4E show schematic diagrams of unidirectional device circuits of the state detection circuit according to several embodiments of the present invention. As shown in FIG. 4A, in one embodiment, the unidirectional device circuit 104 in the state detection circuit 3004 is configured as a P-N junction diode, wherein the forward end of the P-N junction diode is coupled to the test node Nte and the reverse end is coupled to the detection node Nde, for unidirectionally conducting the test node Nte to the detection node Nde. In other embodiments, the unidirectional device circuit 104 can be configured as (but not limited to) one of the following: a Schottky diode (as shown in FIG. 4B), a Zener diode (as shown in FIG. 4C), or a diode-coupled transistor (as shown in FIG. 4D and FIG. 4E), and coupled to the above-mentioned nodes similarly to the above-mentioned P-N junction diode.

Figure 5A:
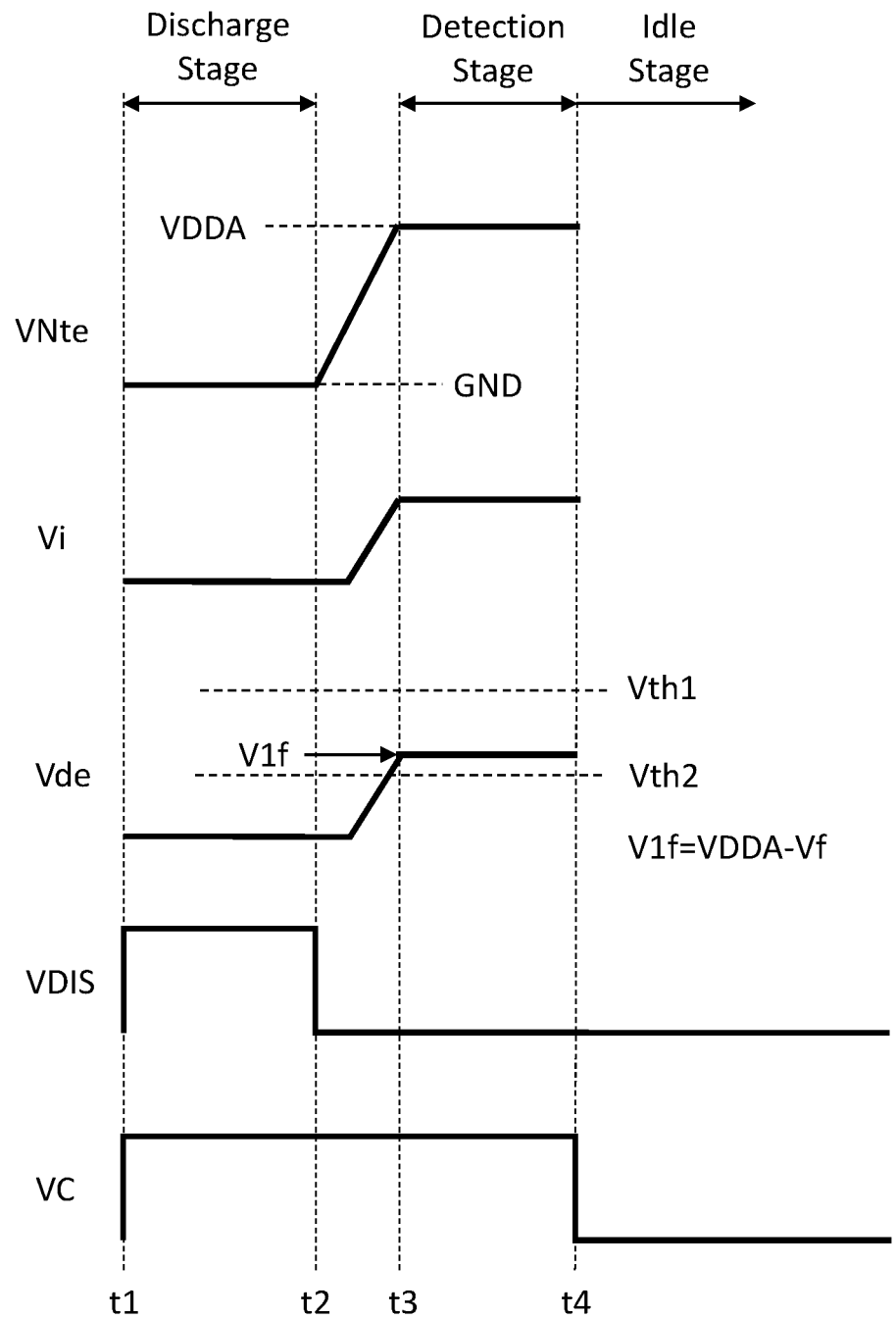
FIG. 5A shows an operation waveform diagram of a state detection circuit according to the present invention when the input node is in a floating state.
Figure 5B:
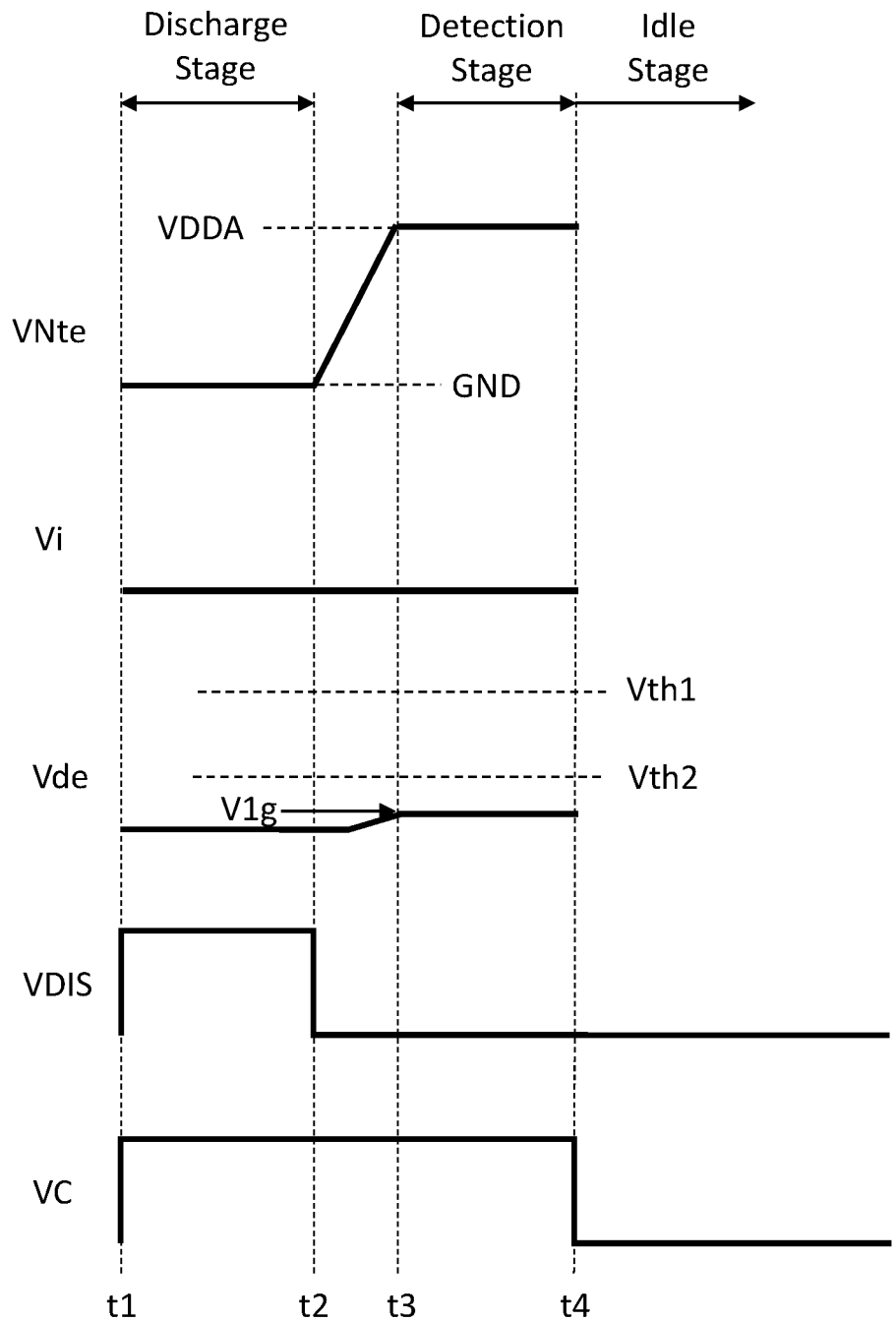
FIG. 5B shows an operation waveform diagram of a state detection circuit according to the present invention when the input node is electrically connected to the ground potential.
Figure 5C:
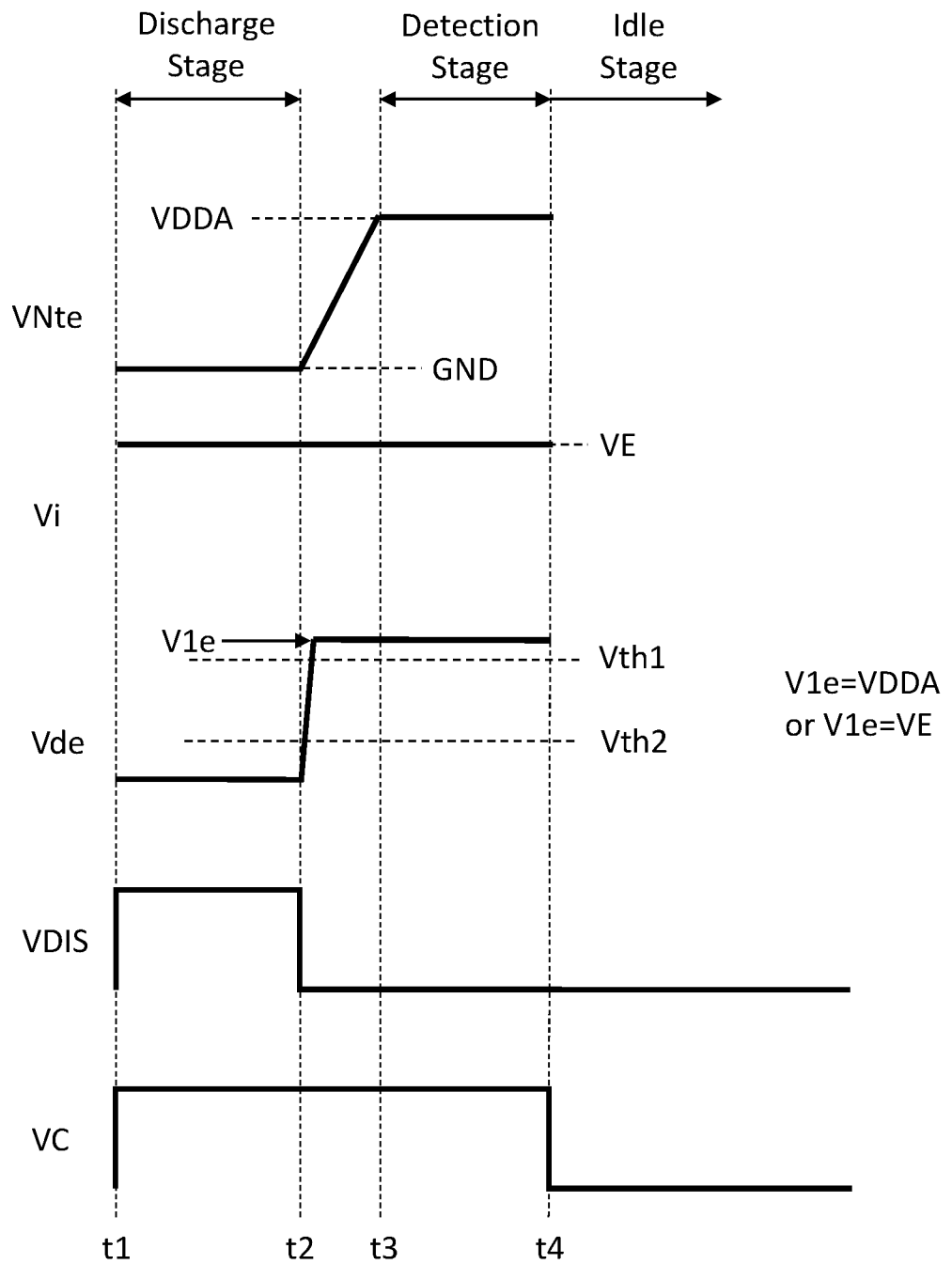
FIG. 5C shows an operation waveform diagram of a state detection circuit according to the present invention when the input node is electrically connected to an external voltage.

Please refer to FIG. 3 and FIGS. 5A to 5C. FIG. 5A shows the operation waveform diagram of the state detection circuit according to the present invention when the input node is in a floating state. FIG. 5B shows the operation waveform diagram of the state detection circuit according to the present invention when the input node is electrically connected to the ground potential. FIG. 5C shows the operation waveform diagram of the state detection circuit according to the present invention when the input node is electrically connected to an external voltage. In one embodiment, when the state detection circuit 3003 operates in the detection stage, the determination circuit 203 determines the state of the input node Ni according to at least one of the following three situations. (1) When the voltage level of the voltage Vde at the detection node Nde is less than the first threshold Vth1 and greater than the second threshold Vth2 (as shown in FIG. 5A), the determination circuit 203 determines that the state of the input node Ni is floating. (2) When the voltage level of the voltage Vde at the detection node Nde is less than the second threshold Vth2 (as shown in FIG. 5B), the determination circuit 203 determines that the state of the input node Ni is electrically connected to the ground potential. (3) When the voltage level of the voltage Vde at the detection node Nde is greater than the first threshold Vth1 (as shown in FIG. 5C), the determination circuit 203 determines that the state of the input node Ni is electrically connected to the external voltage. In the above embodiment, the first threshold Vth1 is greater than the second threshold Vth2. The details of the determination of the state of the input node Ni will be described in detail in the embodiments of FIGS. 11 to 13.

Figure 6A:
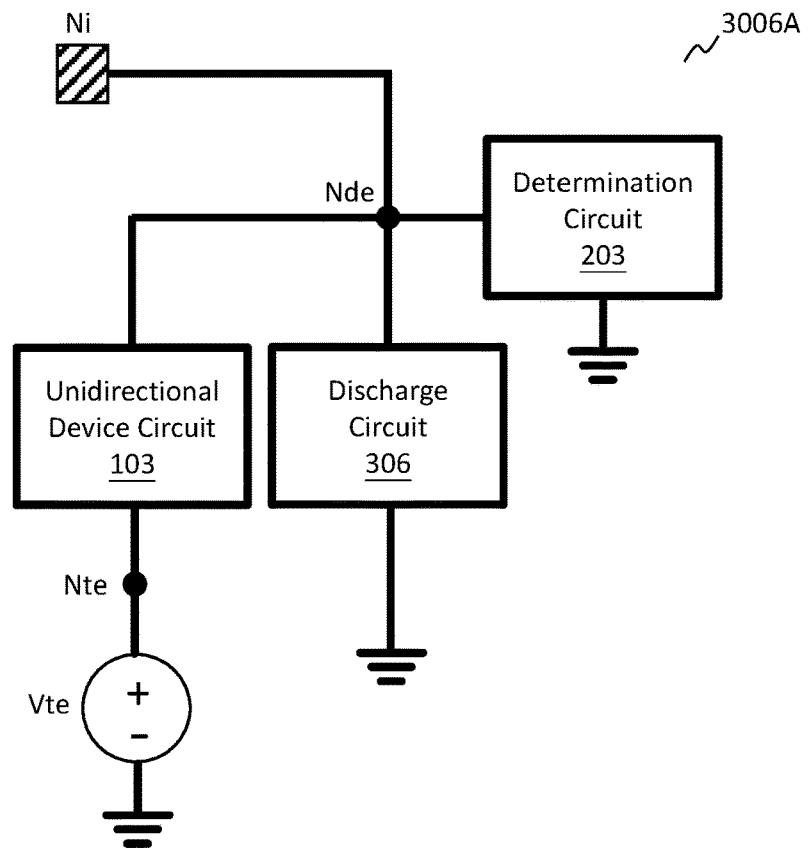
FIG. 6A and FIG. 6B respectively show block diagrams of state detection circuits according to two embodiment of the present invention.
Figure 6B:
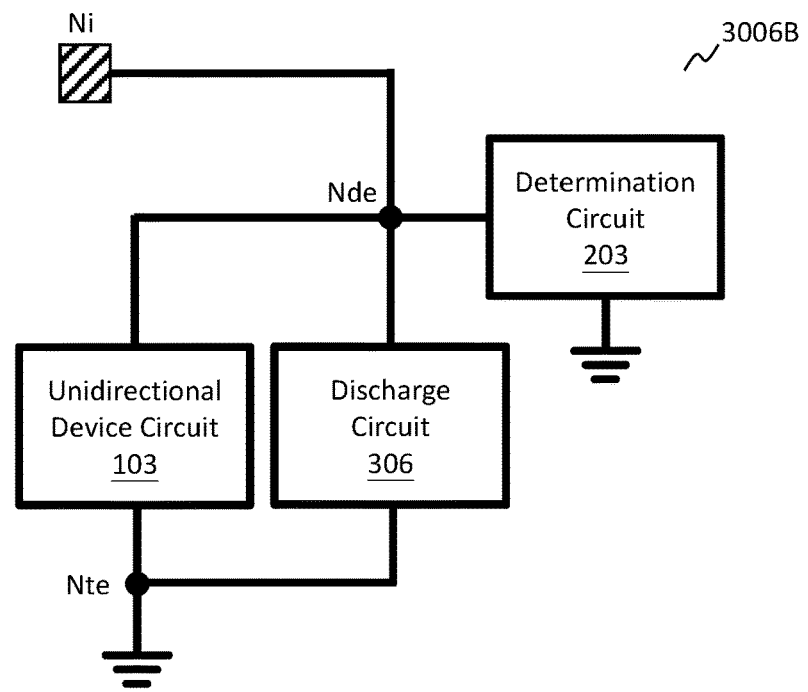

Please refer to FIG. 6A and FIG. 6B. FIGS. 6A and 6B respectively show block diagrams of state detection circuits according to two embodiments of the present invention (state detection circuit 3006A and state detection circuit 3006B). The state detection circuit 3006A of FIG. 6A and the state detection circuit 3006B of FIG. 6B are similar to the state detection circuit 3003 of FIG. 3, but with differences as described below. In one embodiment, the state detection circuit 3006A further includes a discharge circuit 306 configured to discharge the voltage level of the input node Ni to ground potential. In a preferred embodiment, as shown in FIG. 6B, the discharge circuit 306 of the state detection circuit 3006B is coupled in parallel with the unidirectional device circuit 103. During the discharge stage, the state detection circuit 3006B provides the ground potential at the test node Nte. The discharge circuit 306 is configured to electrically conduct the input node Ni and the test node Nte, so as to electrically connect the ground potential of the test node Nte to the detection node Nde and the input node Ni, thereby discharging the voltage levels of the detection node Nde and the input node Ni to ground potential. In the above embodiment, the discharge stage is earlier than the detection stage.

Figure 7:
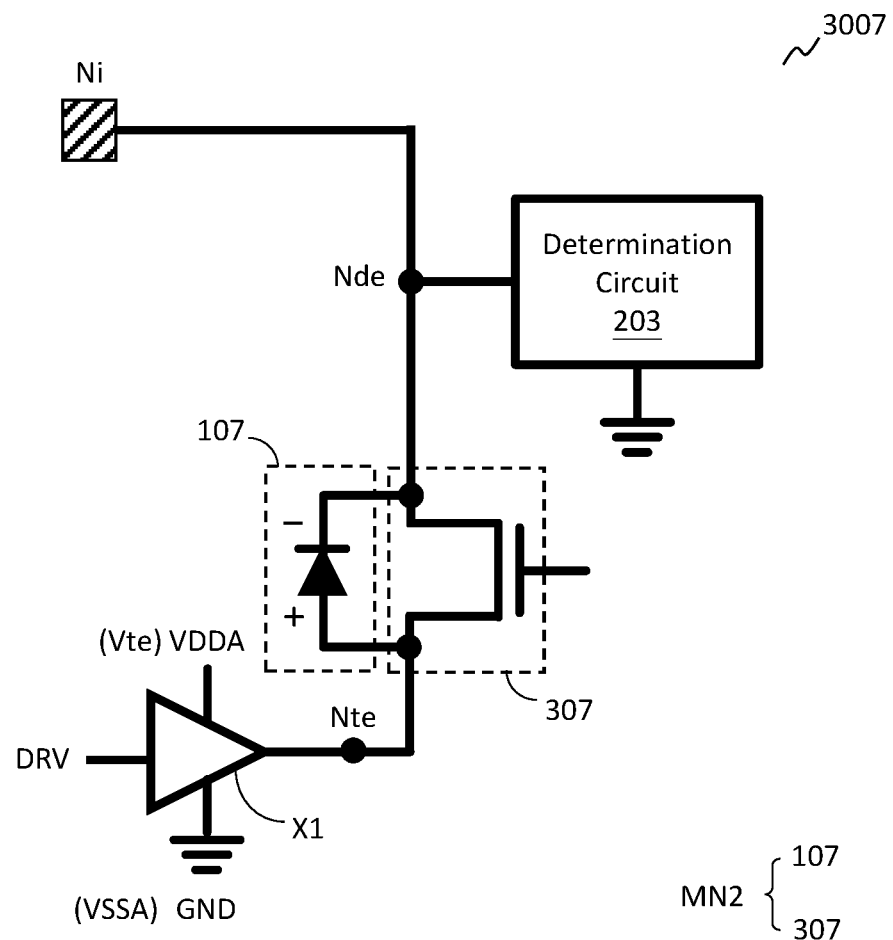
FIG. 7 shows a schematic diagram of a state detection circuit according to an embodiment of the present invention.

Please refer to FIG. 7. FIG. 7 shows a schematic diagram of a state detection circuit according an embodiment of the present invention (state detection circuit 3007). In one embodiment, a metal-oxide-semiconductor (MOS) transistor MN2 includes a discharge circuit 307 and a unidirectional device circuit 107. In this embodiment, the discharge circuit 307 of the state detection circuit 3007 is the switch of MOS transistor MN2, and the unidirectional device circuit 107 is the body diode of the metal-oxide semi-transistor MN2. In one embodiment, the state detection circuit 3007 further includes a buffer circuit X1 configured to generate a test voltage Vte or a discharge voltage VSSA at the test node Nte according to the driving signal DRV. In the present embodiment, the test voltage Vte is a high potential VDDA, and the discharge voltage VSSA is the ground potential GND.

Figure 8:
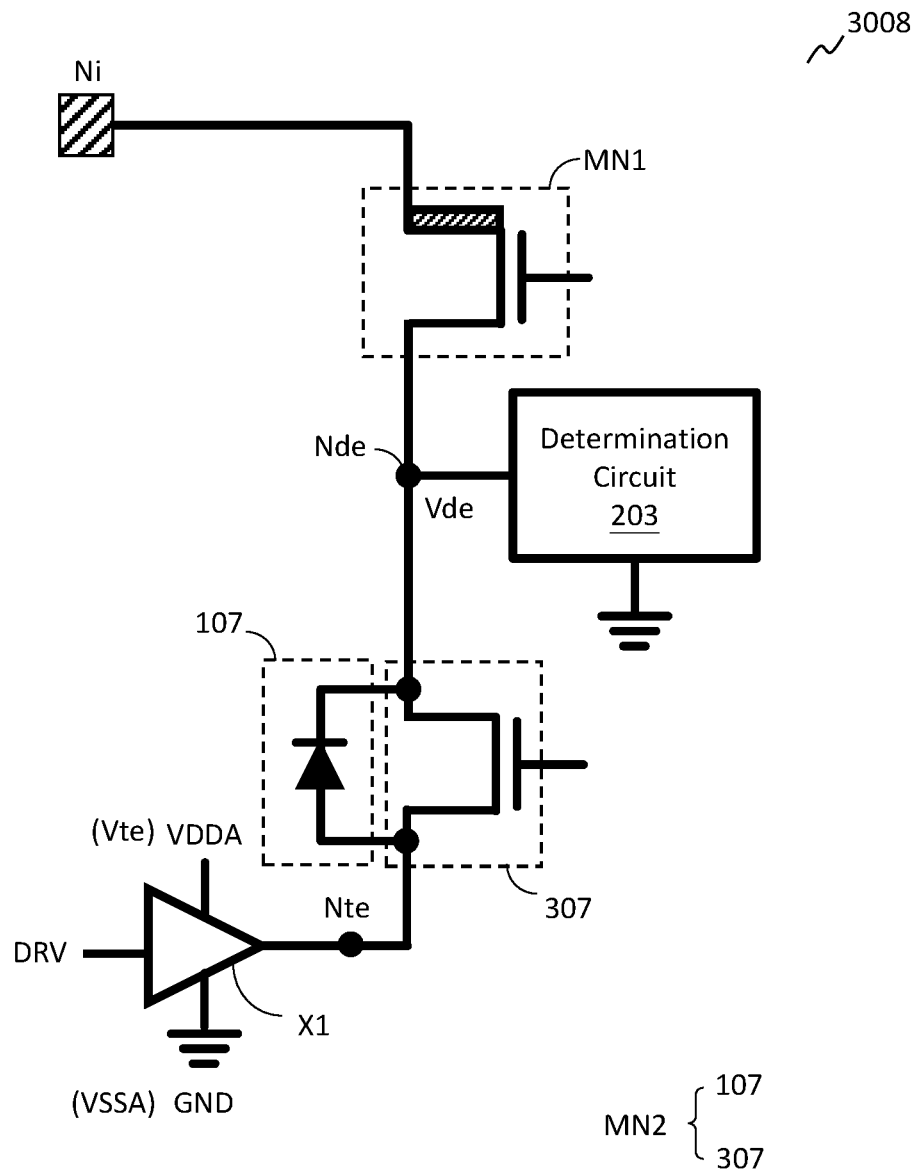
FIG. 8 shows a schematic diagram of a state detection circuit according to an embodiment of the present invention.

Please refer to FIG. 8. FIG. 8 shows a schematic diagram of a state detection circuit according to an embodiment of the present invention (state detection circuit 3008). The state detection circuit 3008 of FIG. 8 is similar to the state detection circuit 3007 of FIG. 7, but is different in that the state detection circuit 3008 further includes a clamping device MN1. As shown in FIG. 8, the clamping device MN1 is coupled between the input node Ni and the detection node Nde, so that the voltage Vde at the detection node Nde is clamped and does not exceed the voltage upper limit Vlim, wherein the voltage upper limit Vlim is less than the smallest one of an absolute maximum rating of a withstand voltage of the unidirectional device circuit 107, an absolute maximum rating of a withstand voltage of the discharge circuit 307, and an absolute maximum rating of a withstand voltage of the determination circuit 203. An absolute maximum rating of a withstand voltage of a corresponding circuit means that, when the voltage Vde at the detection node Nde exceeds the absolute maximum rating of the corresponding withstand voltage, the corresponding circuit will be permanently damaged due to excessive voltage. Therefore, the voltage Vde at the detection node Nde is clamped not to exceed the upper voltage limit Vlim by the clamping device MN1, which can protect the unidirectional device circuit 107, the discharge circuit 307, or the determination circuit 203 from damage. In the above embodiment, the voltage level VE of the external voltage electrically connected to the input node Ni is greater than the absolute maximum rating of the withstand voltage corresponding to the unidirectional device circuit 107, the discharge circuit 307, or the determination circuit 203. In a preferred embodiment, the clamping device MN1 is a metal-oxide-semiconductor (MOS) transistor having a turn-on threshold voltage VTHH, wherein the upper voltage limit Vlim is related to the turn-on threshold voltage VTHH and the enabling level of the MOS transistor. In a preferred embodiment, the clamping device MN1 is a lateral diffused MOS (LDMOS) transistor, which has a lateral diffusion structure capable of withstanding high voltage.

Figure 9:
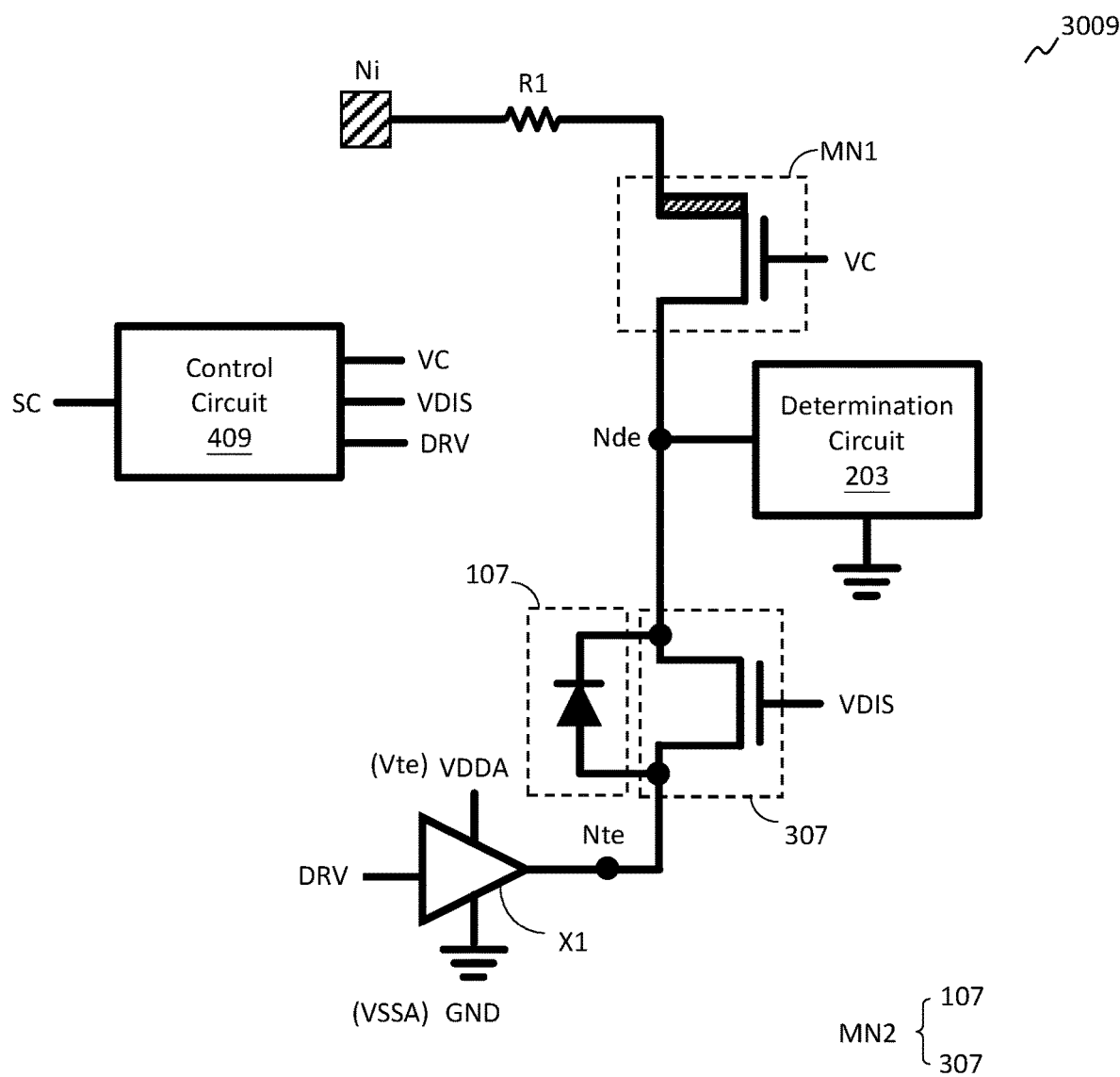
FIG. 9 shows a schematic diagram of a state detection circuit according to a specific embodiment of the present invention.

Please refer to FIG. 9. FIG. 9 shows a schematic diagram of the state detection circuit according to a specific embodiment of the present invention (state detection circuit 3009). The state detection circuit 3009 of FIG. 9 is similar to the state detection circuit 3008 of FIG, but is different in that the state detection circuit 3009 further includes a control circuit 409, and the control circuit 409 is configured to generate the first control signal VDIS, the second control signal VC, and the driving signal DRV according to the signal SC, thereby controlling the state detection circuit 3009 to operate in the detection stage or the discharge stage, wherein the discharge circuit 307 operates according to the first control signal VDIS, and the clamping device MN1 operates according to the second control signal VC. The buffer circuit X1 generates the test voltage Vte or the discharge voltage VSSA at the test node Nte according to the driving signal DRV. In a preferred embodiment, as shown in FIG. 9, the state detection circuit 3009 further includes a resistor R1, and the resistor R1 is coupled between the input node Ni and the detection node Nde for limiting the level of the current flowing through the current path in the detection stage. In a preferred embodiment, the transistor MN1 can be an enhancement type transistor or a depletion type transistor. In the case where the transistor MN1 is a depletion type transistor, since the turn-on threshold is usually a negative value, the second control signal VC can control the gate of the depletion transistor MN1 by means of a lower voltage.

Figure 10:
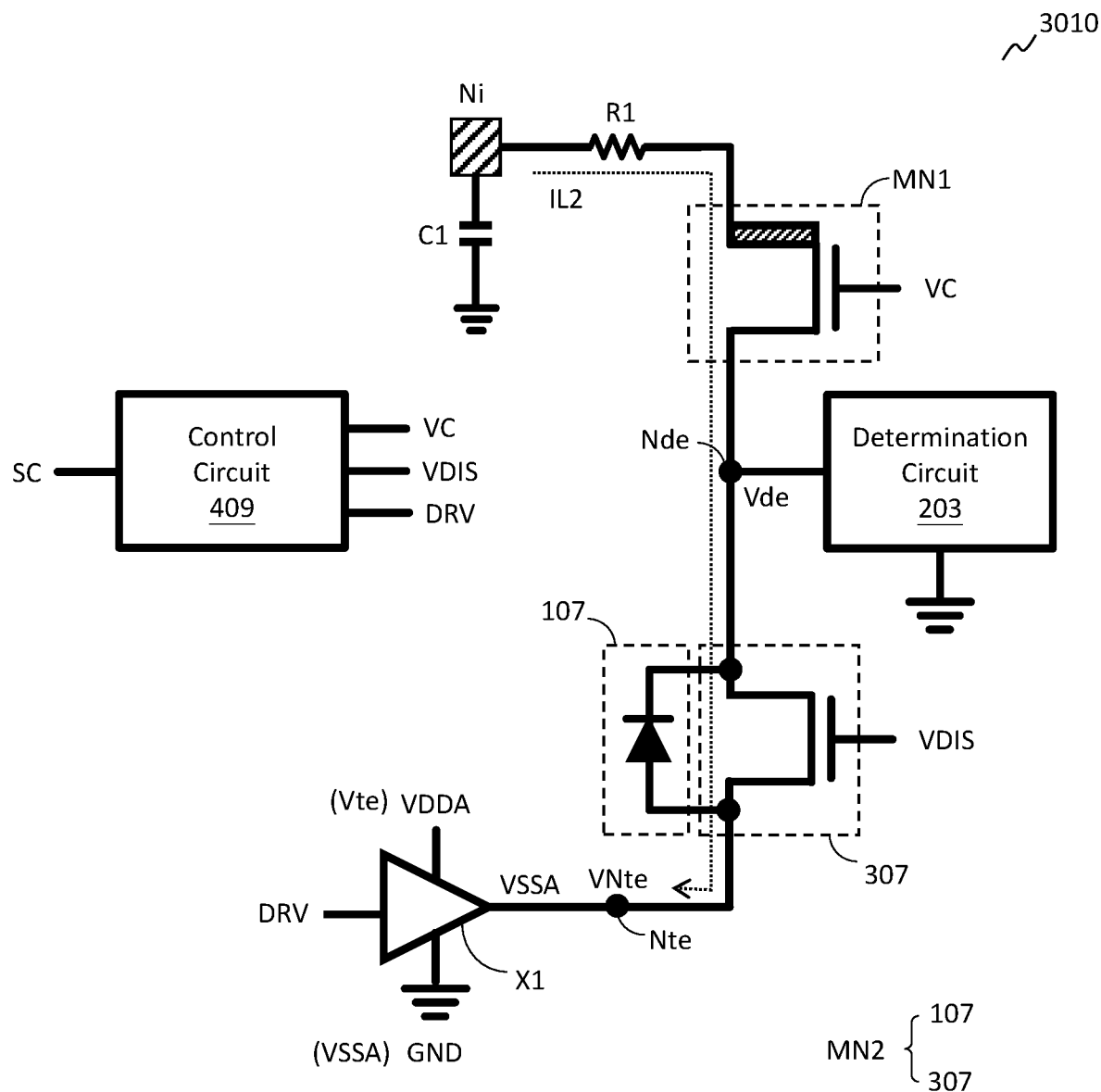
FIG. 10 shows a schematic diagram of a state detection circuit operating in the discharge stage according to a specific embodiment of the present invention.

Please refer to FIG. 10 and FIG. 5A. FIG. 10 shows a schematic diagram of the state detection circuit (state detection circuit 3010) operating in the discharge stage according to a specific embodiment of the present invention. The embodiment of FIG. 10 corresponds to the operation waveform diagram of the discharge stage in FIG. 5A (also corresponding to the discharge stages of FIG. 5B and FIG. 5C). As shown in the embodiment of FIG. 10, when the state detection circuit 3010 operates in the discharge stage, the buffer circuit X1 generates the discharge voltage VSSA (i.e., the ground potential GND) at the test node Nte according to the driving signal DRV, and the first control signal VDIS and the second control signal VC respectively control the discharge circuit 307 and the clamping device MN1 to be ON. Meanwhile, the voltage of the parasitic capacitor C1 on the input node Ni can be discharged to the ground potential GND through the current path IL2, and the voltage levels of the detection node Vde and the input node Ni are discharged to the ground potential GND, so that in the detection stage after the discharge stage, the determination circuit 203 can accurately determine the state of the input node Ni. The above-mentioned embodiment corresponds to the discharge stage (time point t1 to time point t2) in FIG. 5A. In this stage, the voltage level of the voltage VNte on the test node Nte is the ground potential GND, and the first control signal VDIS and the second control signal VC are at high level.

Figure 11:
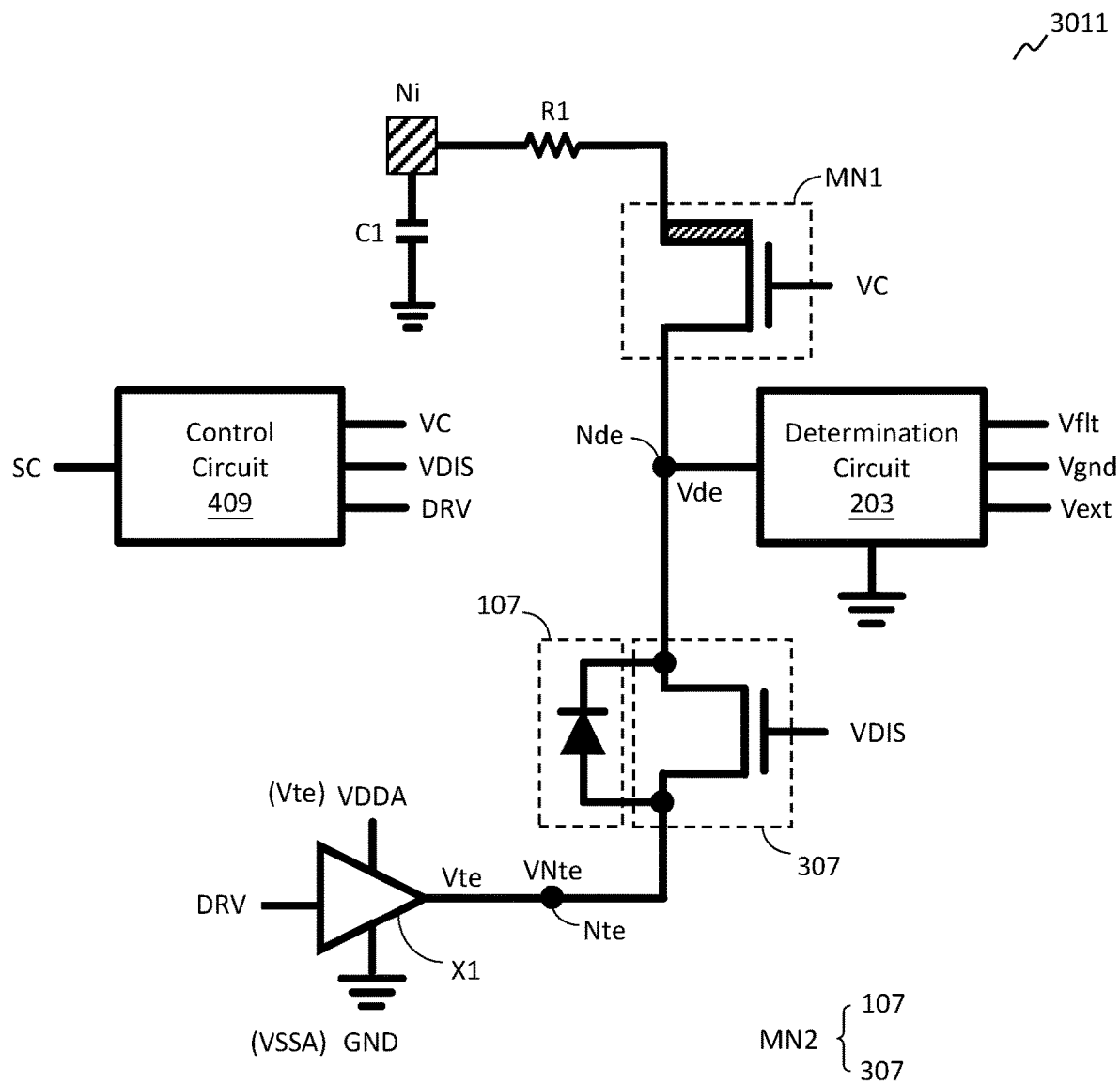
FIG. 11 shows a schematic diagram of a specific embodiment of the present invention when the state detection circuit operates in the detection stage and the state of the input node is floating.

Please refer to FIG. 11. FIG. 11 shows a schematic diagram of a specific embodiment (state detection circuit 3011) when the state detection circuit of the present invention operates in the detection stage and the state of the input node is floating. Referring also to FIG. 5A, in one embodiment, at time t2 after the discharge stage ends, the buffer circuit X1 generates a test voltage Vte (i.e., high potential VDDA) at the test node Nte according to the driving signal DRV; the first control signal VDIS controls the discharge circuit 307 to be OFF, and the second control signal VC controls the clamping device MN1 to still be ON. In the detection stage from time point t3 to time point t4, the voltage level of the voltage VNte on the test node Nte is the high potential VDDA; the first control signal VDIS keeps the discharge circuit 307 to be OFF, and the second control signal VC keeps the clamping device MN1 to be ON. The details as to how the state detection circuit determine the different states of the input node Ni will be described below.

Please still refer to FIG. 5A and FIG. 11, in one embodiment, when the state of the input node Ni is floating, from time point t2 to time point t3 after the discharge stage ends, the voltage level of the voltage VNte on the test node Nte increases as time passes, and when it increases to a level whereby the unidirectional device circuit 107 with the forward conduction voltage Vf is turned on, the test voltage Vte will charge the parasitic capacitance C1 through the unidirectional device circuit 107, the clamping device MN1, and the resistor R1, so that the voltage Vi on the input node Ni increases as time passes, and the voltage Vde of the detection node Nde also increases as time passes. When the voltage Vde of the detection node Nde increases to reach the level of the difference between the test voltage Vte and the forward conduction voltage Vf (as the voltage level V1f shown in FIG. 5A), the unidirectional device circuit 107 is turned off. Therefore, in the detection stage from time point t3 to time point t4, the voltage Vde of the detection node Nde is maintained at the voltage level V1f. In the present embodiment, the voltage level of the voltage VNte on the test node Nte increases to the high level VDDA (test voltage Vte) at time point t3, so that the unidirectional device circuit 107 is turned off, and the voltage Vde of the detection node Nde is maintained at the voltage level V1f in the detection stage, wherein the voltage level V1f is equal to the difference between the high potential VDDA and the forward conduction voltage Vf.

In a specific embodiment, the second threshold Vth2 is less than the difference between the test voltage Vte and the forward conduction voltage Vf, and the first threshold Vth1 is greater than the difference between the test voltage Vte and the forward conduction voltage Vf. Therefore, in the detection stage, when the voltage Vde of the detection node Nde is less than the first threshold Vth1 and greater than the second threshold Vth2, the determination circuit 203 determines that the state of the input node Ni is floating. In one embodiment, the determination circuit 203 controls one of the output signal Vflt, the output signal Vgnd, and the output signal Vext to be in an enabled state according to the determination result. In the above embodiment of FIG. 11, the determination circuit 203 controls the output signal Vf1t to be in the enabled state when the state of the input node Ni is determined to be floating, while the output signal Vgnd and the output signal Vext are controlled to be in the disabled state.

Figure 12:
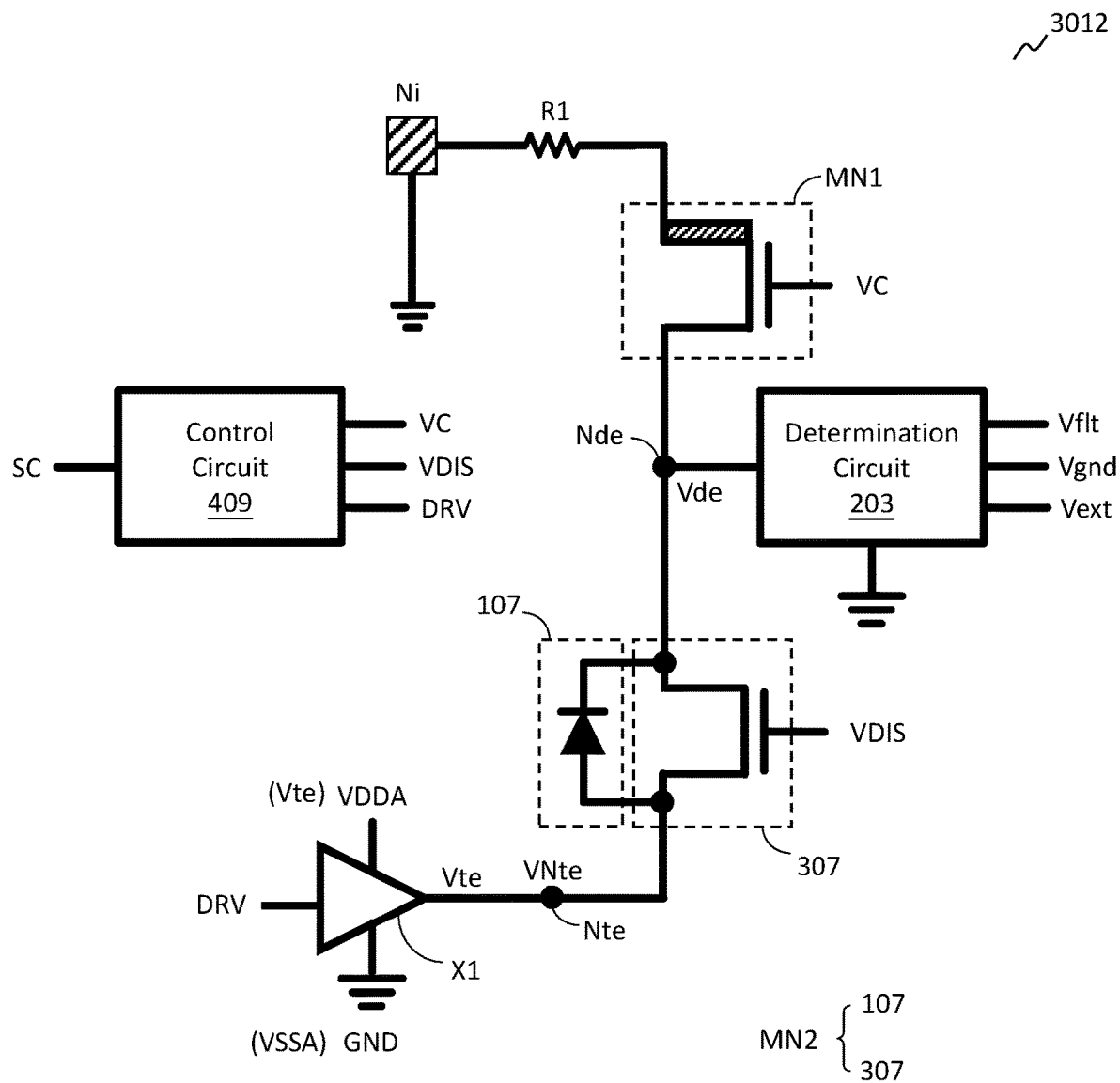
FIG. 12 shows a schematic diagram of a specific embodiment of the present invention when the state detection circuit operates in the detection stage, and the state of the input node is electrically connected to the ground potential.

Please refer to FIG. 12. FIG. 12 shows a schematic diagram of a specific embodiment (state detection circuit 3012) when the state detection circuit of the present invention operates in the detection stage, and the state of the input node is electrically connected to the ground potential. Also referring to FIG. 5B, at time point t2 after the discharge stage ends and in the detection stage from time point t3 to time point t4, the operation waveforms of the voltage VNte on the test node Nte, the first control signal VDIS, and the second control signal VC are same as those shown in FIG. 5A; please refer to the foregoing description and they are not repeated here.

Please still refer to FIG. 5B and FIG. 12, in one embodiment, when the state of the input node Ni is electrically connected to the ground potential, from time point t2 to time point t3 after the discharge stage ends, the voltage level of the voltage VNte on the test node increases as time passes, and when it increases to a level whereby the unidirectional device circuit 107 with the forward conduction voltage Vf is turned on, a current path IL3 is formed by the test voltage Vte through the unidirectional device circuit 107, the clamping device MN1, and the resistor R1. In one embodiment, the resistance of the resistor R1 is far less than the equivalent resistance of the unidirectional device circuit 107 when the unidirectional device circuit 107 is turned on, so that when the state of the input node Ni is electrically connected to the ground potential, in the detection stage, the voltage Vde of the test node Nde is less than the second threshold Vth2 (voltage level V1g shown in FIG. 5B), or far less than the difference between the test voltage Vte and the forward conduction voltage Vf. It should be noted that the relationships among the first threshold value Vth1, the second threshold value Vth2, the test voltage Vte, and the forward conduction voltage Vf are the same as those described in paragraph [0049], so they are not repeated here. In the above embodiment, when the voltage Vde of the detection node Nde is less than the second threshold Vth2, the determination circuit 203 determines that the state of the input node Ni is electrically connected to the ground potential, whereby the output signal Vgnd is controlled to be in the enabled state, while the output signal Vf1t and the output signal Vext are controlled to be in the disabled state.

Figure 13:
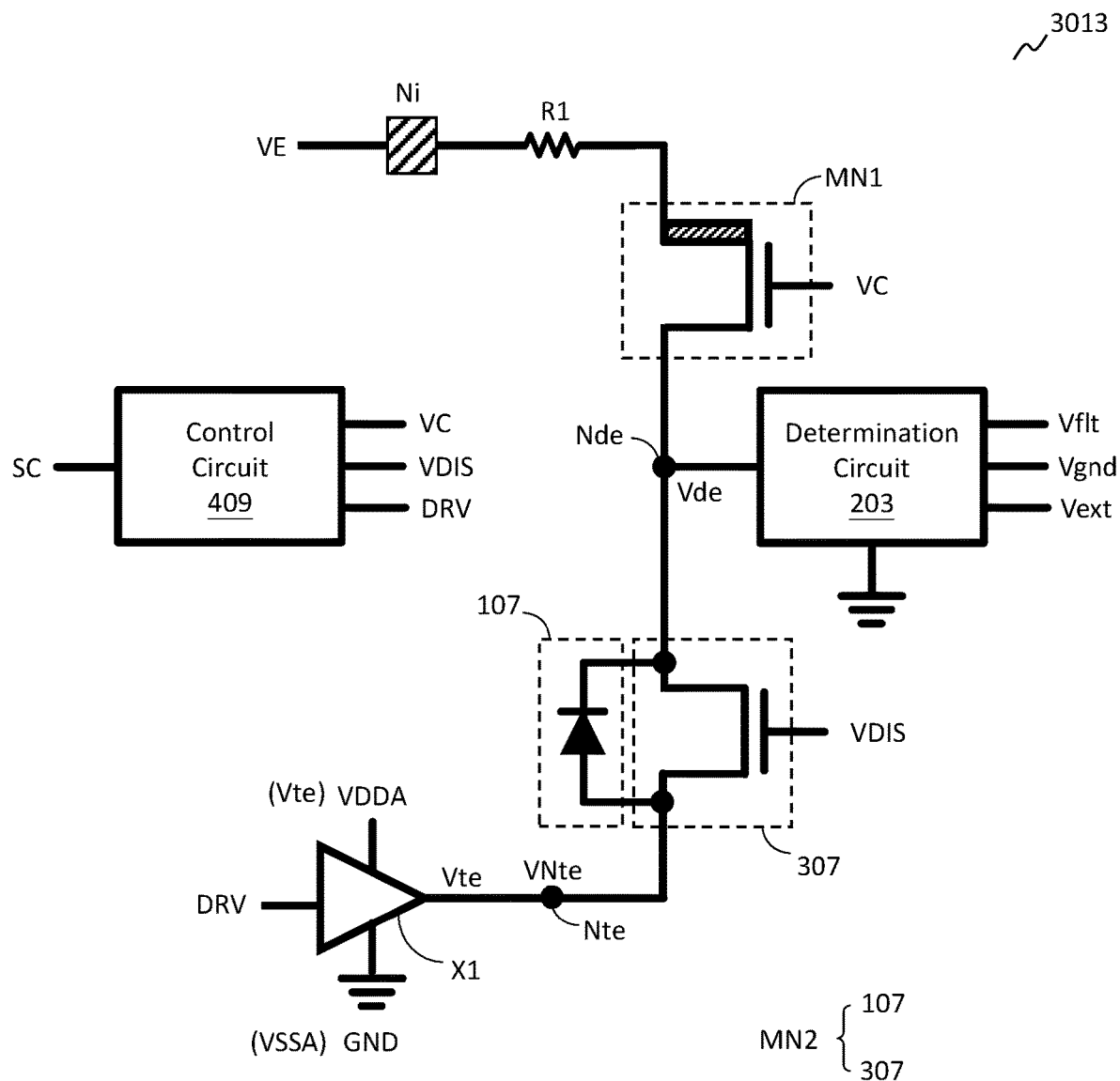
FIG. 13 shows a schematic diagram of a specific embodiment of the present invention when the state detection circuit operates in the detection stage, and the state of the input node is electrically connected to an external voltage.

Please refer to FIG. 13. FIG. 13 shows a schematic diagram of a specific embodiment (state detection circuit 3013) when the state detection circuit of the present invention operates in the detection stage, and the state of the input node is electrically connected to an external voltage. Also referring to FIG. 5C, at time point t2 after the discharge stage ends and in the detection stage from time point t3 to time point t4, the operation waveforms of the voltage VNte on the test node Nte, the first control signal VDIS, and the second control signal VC are same as those shown in FIG. 5A; please refer to the foregoing description and they are not repeated here.

Please still refer to FIG. 5C and FIG. 13. In one embodiment, when the state of the input node Ni is electrically connected to an external voltage and the external voltage (eg, voltage level VE) is greater than or equal to the test voltage Vte (high potential VDDA), after the discharge stage ends, the unidirectional device circuit 107 is reverse-biased and does not conduct. As illustrated in the embodiment of FIG. 8, the voltage level of the voltage Vde at the detection node Nde is clamped by the clamping device MN1 and does not exceed the upper voltage limit Vlim. In one embodiment, the clamping device MN1 is a metal-oxide-semiconductor transistor, having a turn-on threshold voltage VTHH. In a preferred embodiment, the enabled level of the metal-oxide-semiconductor transistor is a sum of the test voltage Vte plus the turn-on threshold voltage VTHH, so that the voltage upper limit Vlim is equal to the voltage level of the test voltage Vte (as shown by the voltage level V1e in FIG. 5C, which is the high level VDDA in the present embodiment). In the present embodiment, the first threshold value Vth1 is less than the upper voltage limit Vlim (i.e., the first threshold value Vth1 is less than the voltage level of test voltage Vte).

In another embodiment, as in the embodiment of FIG. 7, when the state detection circuit does not include the clamping device MN1, in the detection stage, the voltage level of the voltage Vde at the detection node Nde is close to the voltage level VE of the external voltage level (as shown by the voltage level V1e in FIG. 5C, which is the voltage level VE in the present embodiment). In the present embodiment, the first threshold Vth1 is less than the voltage level VE of the external voltage, and can be greater than the voltage level of the test voltage Vte.

In the above two embodiments (the state detection circuit of FIG. 13 including the clamping device MN1 and the state detection circuit of FIG. 7 not including the clamping device MN1), regardless whether the clamping device MN1 is included or not, the determination can be made as thus: when the voltage level of the voltage Vde at the detection node Nde is greater than the first threshold Vth1, the determination circuit 203 determines that the state of the input node Ni is electrically connected to the external voltage, whereby the output signal Vext is controlled to be in the enabled state, and the output signal Vf1t and the output signal Vgnd are controlled to be in the disabled state.

Figure 14:
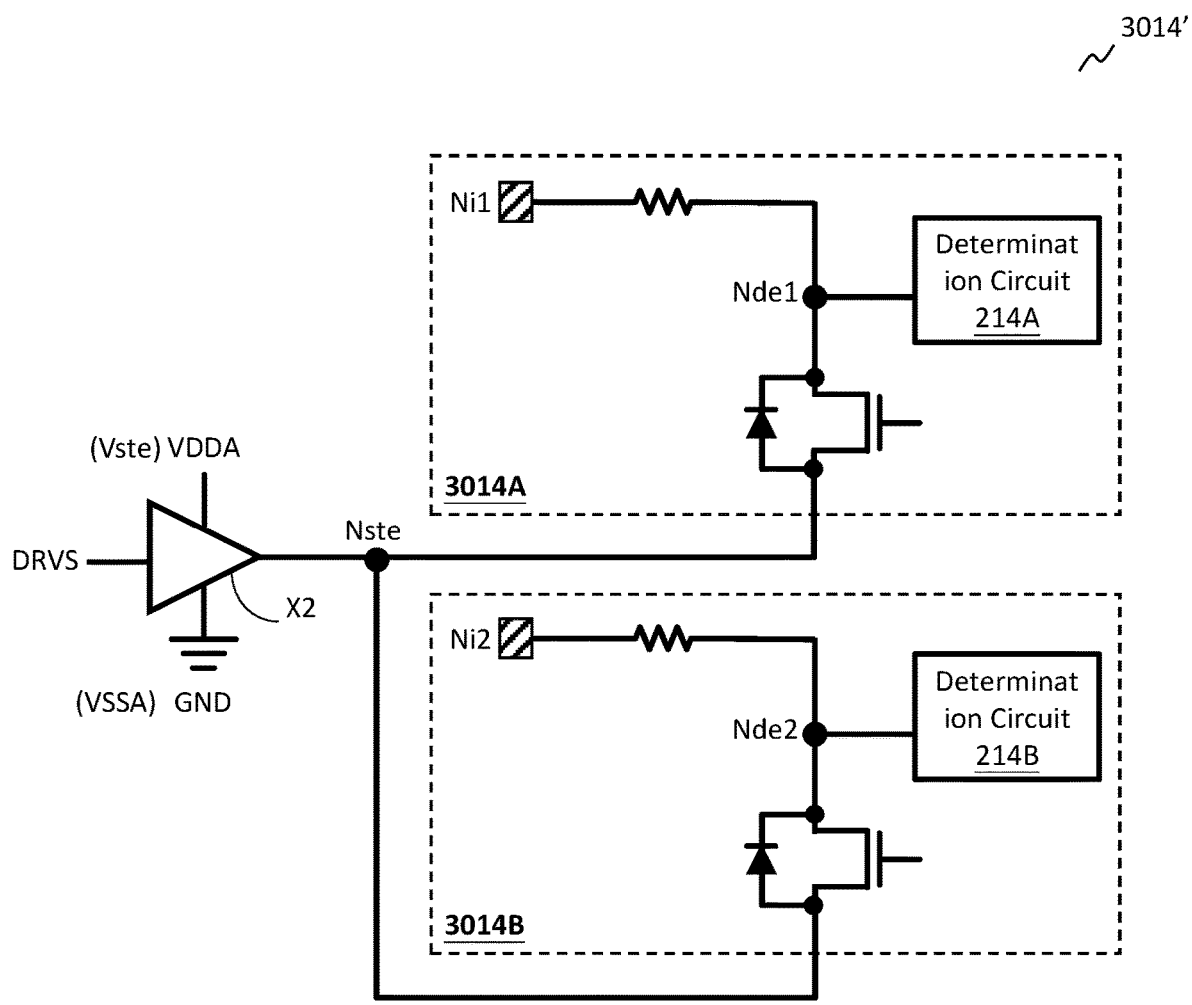
FIG. 14 shows a schematic diagram of the state detection circuit used in a multi-pin state detection circuit according to an embodiment of the present invention.

Referring to FIG. 14. FIG. 14 shows a schematic diagram of an embodiment of the state detection circuit of the present invention which is used in a multi-pin state detection circuit (multi-pin state detection circuit 3014'). In one embodiment, the multi-pin state detection circuit 3014' includes plural state detection circuits and a shared buffer circuit X2. In one embodiment, the plural state detection circuits include, for example, the state detection circuit 3014A and the state detection circuit 3014B as shown in FIG. 14. The test nodes of the state detection circuit 3014A and the state detection circuit 3014B are commonly coupled to the common test node Nste. In the detection stage, the multi-pin state detection circuit 3014' provides the common test voltage Vste at the common test node Nste. In the discharge stage, the multi-pin state detection circuit 3014' provides the discharge voltage VSSA at the common test node Nste. In one embodiment, the shared buffer circuit X2 is configured to generate a common test voltage Vste (e.g., high potential VDDA) or a discharge voltage VSSA (e.g., ground potential GND) at the common test node Nste according to the common driving signal DRVS.

According to the embodiment of FIG. 14, in the detection stage, through the shared buffer circuit X2 generating the shared test voltage Vste at the shared test node Nste, the determination circuit 214A and the determination circuit 214B can determine whether the states of the input node Ni1 and the input node Ni2 are floating, electrically connected to the ground potential, or electrically connected to an external voltage according to the voltage level of the detect node Nde1 and the node Nde2, respectively, by approaches as described in the foregoing embodiments. The present embodiment can determine the tri-states of multiple pins simultanteously, and the plural state detection circuits can share one same buffer circuit, so the area can be further saved and the overall performance is even more improved.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A state detection circuit configured to detect whether a coupling state of an input node is floating, electrically connected to a ground potential, or electrically connected to an external voltage, wherein the state detection circuit comprises:
   a unidirectional-conductive device, configured to unidirectionally conduct from a test node to a detection node, the detection node being coupled to the input node, wherein a current path is formed by the test node, the unidirectional-conductive device, the detection node, and the input node, wherein the voltage across the unidirectional-conductive device, when conducting, is a forward conduction voltage;
   a voltage generation circuit, configured to generate and control a voltage at the test node to a high potential during a detection stage, wherein a voltage level of the detection node is determined according to the coupling state of the input node, the high potential, the conduction state of the unidirectional-conductive device, and the forward conduction voltage; and
   a determination circuit, configured to determine the coupling state of the input node in the detection stage according to at least one of the following conditions:
      (1) when the voltage level of the detection node is less than a first threshold and greater than a second threshold, the determination circuit determines that the coupling state of the input node is floating;
      (2) when the voltage level of the detection node is less than the second threshold, the determination circuit determines that the coupling state of the input node is electrically connected to the ground potential; and/or
      (3) when the voltage level of the detection node is greater than the first threshold, the determination circuit determines that the coupling state of the input node is electrically connected to the external voltage;
   wherein the external voltage is greater than or equal to the voltage at the test node, wherein the first threshold is greater than the second threshold.

2. The state detection circuit of claim 1, wherein in the detection stage, when the coupling state of the input node is electrically connected to the potential, the ground unidirectional-conductive device is conducting; when the coupling state of the input node is electrically connected to the external voltage, the unidirectional-conductive device is non-conducting.

3. The state detection circuit of claim 1, further comprising a discharge circuit coupled to the detection node, wherein in a discharge stage, the voltage generation circuit further configured to control the voltage at the test node to a ground potential, the discharge circuit being configured to electrically connect the ground potential of the test node to the detection node and the input node, so as to discharge the voltage levels of the detection node and the input node to the ground potential, wherein the discharge stage is earlier than the detection stage.

4. The state detection circuit of claim 3, wherein the discharge circuit is coupled in parallel with the unidirectional-conductive device.

5. The state detection circuit of claim 4, wherein the discharge circuit comprises a first transistor, which is a switch of a metal-oxide-semiconductor (MOS) transistor, and the unidirectional-conductive device corresponds to a body diode of the MOS transistor.

6. The state detection circuit of claim 3, wherein the voltage generation circuit including a buffer circuit configured to control the voltage at the test node to the high potential or the ground potential according to a driving signal.

7. The state detection circuit of claim 6, further comprising a control circuit configured to generate a first control signal and the driving signal, thereby controlling the state detection circuit to operate in the detection stage or the discharge stage, wherein the discharge circuit operates according to the first control signal.

8. The state detection circuit of claim 3, further comprising a clamping device coupled between the input node and the detection node, so that the voltage level of the detection node is clamped and does not exceed a voltage upper limit, wherein the voltage upper limit is less than the smallest one of the following: an absolute maximum rating of a withstand voltage of the unidirectional-conductive device, an absolute maximum rating of a withstand voltage of the discharge circuit, and an absolute maximum rating of a withstand voltage of the determination circuit;
   wherein the voltage level of the external voltage is greater than the absolute maximum rating of the withstand voltage of the unidirectional-conductive device, the absolute maximum rating of the withstand voltage of the discharge circuit, or the absolute maximum rating of the withstand voltage of the determination circuit.

9. The state detection circuit of claim 8, wherein the clamping device is a metal-oxide-semiconductor transistor having a turn-on threshold voltage, wherein the upper voltage limit is related to the turn-on threshold voltage and an enabling level of the MOS transistor.

10. The state detection circuit of claim 9, wherein the enabling level of the MOS transistor is a sum of the high potential and the turn-on threshold voltage, so that the upper voltage limit is equal to the high potential.

11. The state detection circuit of claim 9, wherein the clamping device is a depletion-type MOS transistor, or a depletion-type lateral diffused MOS transistor.

12. The state detection circuit of claim 8, wherein the first threshold is less than the upper voltage limit.

13. The state detection circuit of claim 3, which is used in a multi-pin state detection circuit, wherein the unidirectional-conductive device and the determination circuit are corresponding to sub-state detection circuit, wherein the multi-pin state detection circuit comprises:
   a plurality of the sub-state detection circuits, wherein a plurality of the test nodes of the plurality of sub-state detection circuits are commonly coupled to a common test node, and
   the voltage generation circuit, configured to generate and control a voltage at the common test node to the high potential during the detection stage, and configured to control the voltage at the common test node to the ground potential during the discharge stage.

14. The state detection circuit of claim 3, wherein in the detection stage, when the coupling state of the input node is floating, the unidirectional-conductive device is first conducting and is then non-conducting after the voltage level of the detection node being charged up by the unidirectional-conductive device.

15. The state detection circuit of claim 1, further comprising a resistor, wherein the resistor is coupled between the input node and the detection node for limiting the level of a current flowing through the current path in the detection stage.

16. The state detection circuit of claim 15, wherein a resistance of the resistor is less than an equivalent resistance of the unidirectional-conductive device when it is turned on, so that when the coupling state of the input node is electrically connected to the ground potential, in the detection stage, the voltage level of the detection node is less than the second threshold.

17. The state detection circuit of claim 1, wherein the unidirectional-conductive device comprises a P-N junction diode, a Schottky diode, a Zener diode, or a diode-coupled transistor.

18. The state detection circuit of claim 1, wherein the second threshold is less than a difference between the high potential and the forward conduction voltage, and the first threshold value is greater than the difference between the high potential and the forward conduction voltage.

19. A state detection method, configured to detect that a coupling state of an input node is floating, electrically connected to a ground potential, or electrically connected to an external voltage, wherein the state detection method comprises:
   providing a unidirectional-conductive device configured to unidirectionally conduct from a test node to a detection node, and electrically conducted the detection node to the input node, so that the test node, the unidirectional-conductive device, the detection node, and the input node form a current path, wherein the voltage across the unidirectional-conductive device, when conducting, is a forward conduction voltage;
   providing and controlling a voltage at the test node to a high potential during a detection stage, thereby determining a voltage level of the detection node according to the coupling state of the input node, the high potential, the conduction state of the unidirectional-conductive device, and the forward conduction voltage; and
   determining the coupling state of the input node in the detection stage according to at least one of the following conditions:
      (1) when the voltage level of the detection node is less than a first threshold and greater than a second threshold, determining that the coupling state of the input node is floating;
      (2) when the voltage level of the detection node is less than the second threshold, determining that the coupling state of the input node is electrically connected to the ground potential; and/or
      (3) when the voltage level of the detection node is greater than the first threshold, determining that the coupling state of the input node is electrically connected to the external voltage;
   wherein the external voltage is greater than or equal to the voltage at the test node, wherein the first threshold is greater than the second threshold.

* * * * *